(12) United States Patent
Huang et al.

(10) Patent No.: US 6,236,114 B1
(45) Date of Patent: May 22, 2001

(54) BONDING PAD STRUCTURE

(75) Inventors: Min-San Huang; Huan-Sung Fu; Ling-Sung Wang, all of Hsinchu; Yong-Kang Wang, Tao-Yuan Hsien; Jyh-Ren Wu, Taipei; Shung-Bing Yang, Hsinchu Hsien, all of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/306,097

(22) Filed: May 6, 1999

(51) Int. Cl.⁷ ................................................ H01L 23/48

(52) U.S. Cl. .......................... 257/758; 257/774; 257/786

(58) Field of Search ..................................... 257/782, 786, 257/758, 774

(56) References Cited

U.S. PATENT DOCUMENTS 5,923,088 * 7/1999 Shiue et al. ........................ 257/786

* cited by examiner

*Primary Examiner*—Roy Potter
(74) *Attorney, Agent, or Firm*—Jiawei Huang; J. C. Patents

(57) ABSTRACT

A bonding pad is described. A substrate having integrated circuits formed therein is provided. A dielectric layer having several trench structure formed therein is formed over the substrate, and each trench structure has several trenches radially arranged in the dielectric layer. A conductive layer is formed on the dielectric layer and fills the trenches, and the conductive layer is electrically coupled to the integrated circuits in the substrate through the trenches, respectively. By using the invention, the adhesion of the dielectric layers and the metal layers can be greatly improved and the compressive mechanical stress can be uniformly released to the substrate even if the wire width of the integrated circuit is reduced to the sub-micron level.

11 Claims, 2 Drawing Sheets

BONDING PAD STRUCTURE

BACKGROUND OF THE INVENTION

1. Field of the Invention

The present invention relates to a semiconductor device. More particularly, the present invention relates to a bonding pad structure.

2. Description of the Related Art

Typically, the structure of a bonding pad includes multiple layers of dielectric layers and metal layers. The adhesion of the dielectric layers and the metal layers is poor and compressive mechanical stress acts on the dielectric layer while bonding wires are bonded to bonding pads by thermocompression, so that the bonding pads often peel off and the dielectric layers often crack. Hence, the package yield and the reliability are relatively low.

In order to overcome the problem caused by the formation of the bonding wires, several bonding pad structures referred to in T. W. U.S. Pat. No. 248,340, T. W. U.S. Pat. No. 329,984 and U.S. Pat. No. 4,984,061 are developed. The ideas of those bonding pad structures are the same, that is, forming holes in the dielectric layers. By using the bonding pad structures, the adhesion of the dielectric layers and the metal layers can be improved. At the same time, the stress induced while the wire bonding step is performed can be released to the substrate via those holes. Therefore, the bonding pads peeling off can be suppressed. However, when the hole size shrinks in the next generation of technology, the efficacy of the structures mentioned above is minimal, since contact area of the hole decreases.

SUMMARY OF THE INVENTION

The invention provides a bonding pad. By using the invention, the adhesion of the dielectric layers and the metal layers can be greatly improved and compressive mechanical stress can be uniformly released by the substrate even if the wire width of the integrated circuit is reduced to the sub-micron level.

To achieve these and other advantages and in accordance with the purpose of the invention, as embodied and broadly described herein, the invention provides a bonding pad located on a substrate having integrated circuits formed therein. A dielectric layer having several trench structures formed therein is formed over the substrate, and each trench structure has several trenches radially arranged in the dielectric layer. A conductive layer is formed on the dielectric layer and fills the trenches, and the conductive layer is electrically coupled to the integrated circuits in the substrate through the trenches, respectively.

The invention provides a bonding pad located on a substrate having integrated circuits formed therein. Alternating dielectric layers with conductive layers are formed over the substrate, and each of the dielectric layers has several trench structures formed therein. Each of the trench structures has several trenches radially arranged in the dielectric layers and the trench structures in adjacent dielectric layers are staggered with respect to each other. The dielectric layers are electrically coupled to each other through the trenches and one of the dielectric layers above the substrate is electrically coupled to the substrate through the trenches in this particular dielectric layer.

The invention provides a bonding pad located on a substrate having integrated circuits formed therein. Alternating dielectric layers with conductive layers are formed over the substrate, and each of the dielectric layers has several trench structures formed therein. Each of the trench structures has four trenches arranged in a tetraskelion in the dielectric layers and the trench structures in adjacent dielectric layers are staggered with respect to each other. The dielectric layers are electrically coupled to each other through the trenches and one of the dielectric layers above the substrate is electrically coupled to the substrate through the trenches in this particular dielectric layer. Since the trench structure can provide a relatively large contact area, the adhesion of the dielectric layers and the metal layers can be greatly improved. Additionally, the compressive mechanical stress from any direction, which is induced while the wire bonding step is performed, can be uniformly released to the substrate through the trench structures in the bonding pad even if the wire width of the integrated circuit is reduced to the sub-micron level.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
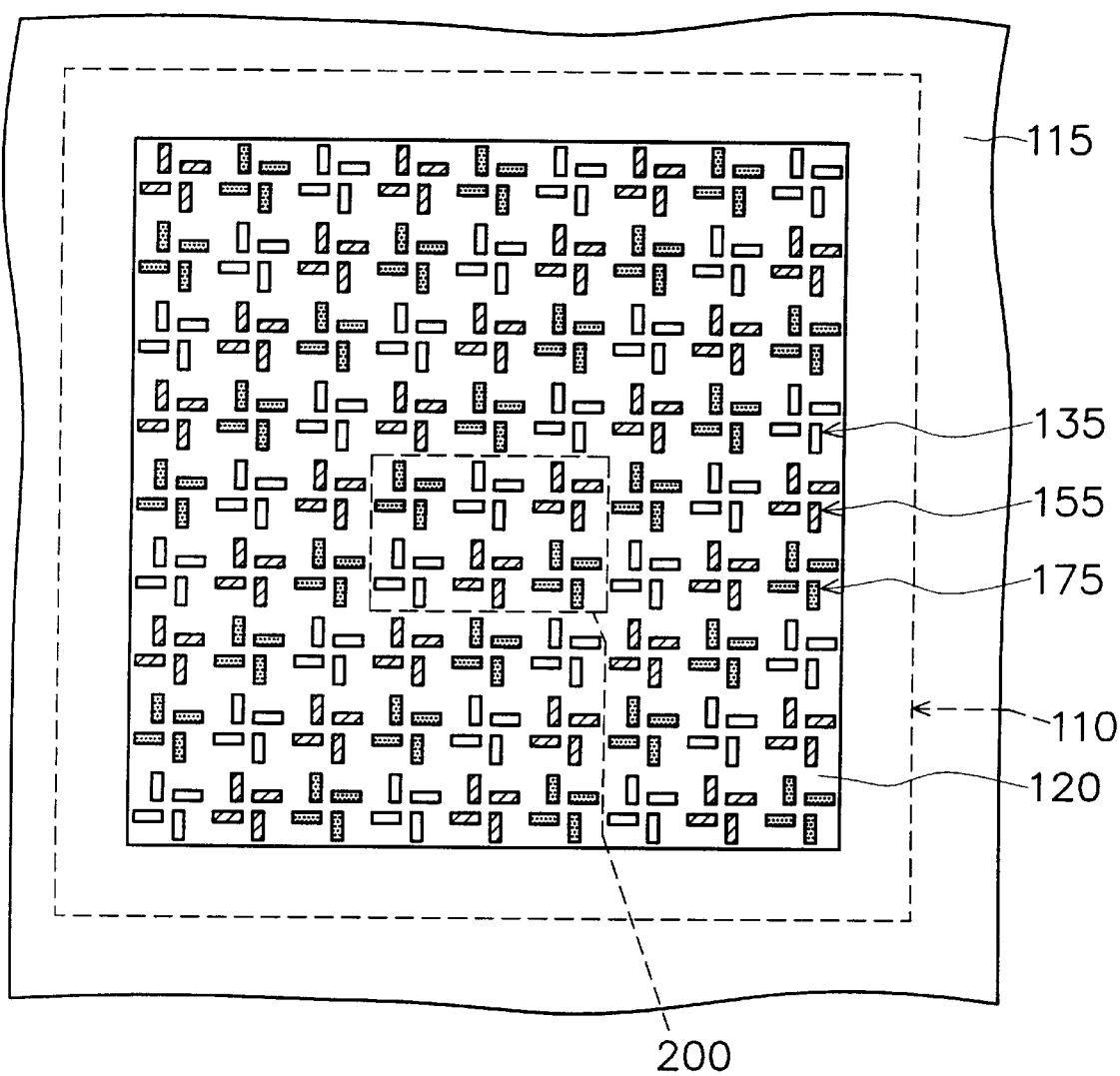
FIG. 1 is a top view of a bonding pad in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
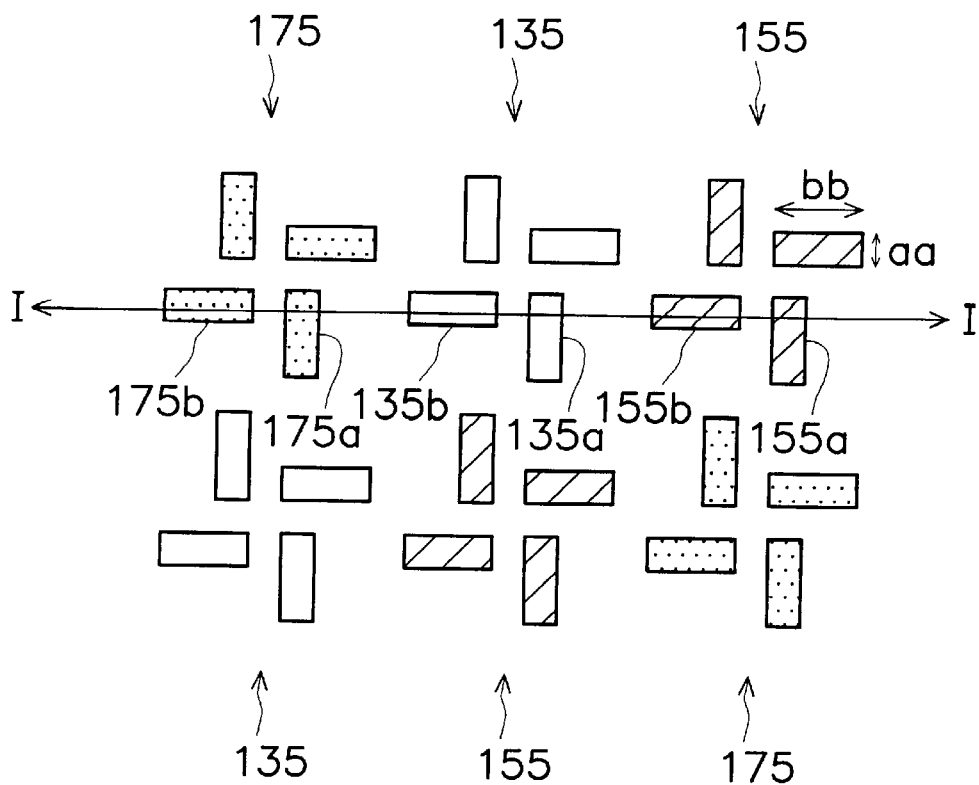
FIG. 2 is a magnified top view of box 200 in FIG. 1.
Figure 3:
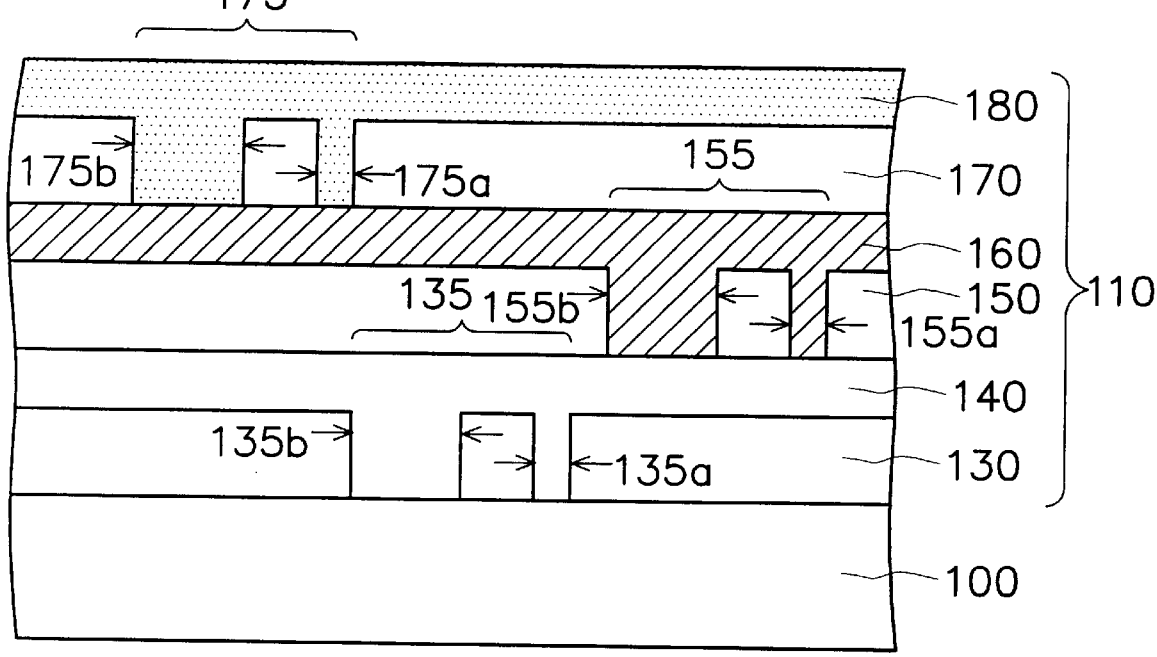
FIG. 3 is a schematic, cross-sectional view taken along the line I—I in FIG. 2.

FIG. 1 is a top view of a bonding pad in a preferred embodiment according to the invention. FIG. 2 is a magnified top view of box 200 in FIG. 1. FIG. 3 is a schematic, cross-sectional view taken along the line I—I in FIG. 2.

As shown in FIG. 1, a substrate 100 having integrated circuits (not shown) previously formed therein is provided. A bonding pad 110 is located on the substrate 100. A passivation layer 115 with a bonding pad hole 120 sits on the bonding pad 110, wherein the bonding pad hole 120 exposes the surface of the bonding pad 110 and is used as a contact hole for the wire bonding step. The bonding pad 110 is constructed by multiple layers of dielectric layers and conductive layers, wherein each dielectric layer has a trench structure.

As shown in FIG. 2 together with FIG. 3, the bonding pad 110 (as shown in FIG. 3) with a six-layer structure is constructed by alternating dielectric layers 130, 150 and 170 with conductive layers 140, 160 and 180 (as shown in FIG. 3). Trench structures 135, 155 and 175 (as shown in FIG. 2) are respectively formed in the dielectric layers 130, 150 and 170 (as shown in FIG. 3). Each of the trench structures 135, 155 and 175 (as shown in FIG. 2) is composed of four trenches. In other words, there are two pairs of trenches and the two pairs of trenches are perpendicular to each other.

Taking the trench structure 175 as an example, each trench in trench pair 175a is staggered and parallel to the other. The trenches in the other trench pair 175b are staggered and parallel to each other, as well. Additionally, the two pairs of trenches 175a and 175b are perpendicular to each other and together construct a tetraskelion trench structure. Since each of the trench structures 135, 155 and 175 is a tetraskelion, the compressive mechanical stress from any direction, which stress is induced by the wire bonding step, can be uniformly released into the substrate 100 through the trench structures 135, 155 and 175. The width of each trench is denoted as a distance aa and the length of each trench isdenoted as a distance bb. Preferably, the distance aa is similar to the size of the contact hole or the via hole and the distance bb is larger than the distance aa. Furthermore, because the trench structures of the bonding pad in the invention are used instead of the holes of the conventional bonding pad, the contact area between the conductive layer and the substrate is greatly increased. Although the wire width of the integrated circuit is reduced to the sub-micron level, the trench structure still can provide a relatively large contact area. Therefore, the adhesion of the dielectric layers and the metal layers can be greatly improved, and, at the same time, the stress induced while the wire bonding step is performed can be uniformly released to the substrate through the trench structures in the bonding pad even if the wire width of the integrated circuit is reduced to the sub-micron level.

Additionally, as shown in FIG. 3, the trench structures 135, 155 and 175 respectively formed in adjacent dielectric layers 130, 150 and 170 are staggered with respect to each other. The conductive layer 140 is electrically coupled to the conductive layer 160 via the trenches 155a and 155b. The conductive layer 180 is electrically coupled to the conductive layer 160 via the trenches 175a and 175b. The conductive layer 140 is electrically coupled to a device (not shown) in the substrate 100 via trenches 135a and 135b.

In this example, the structure of the bonding pad is denoted as a six-layer structure constructed by alternating dielectric layers 130, 150 and 170 with conductive layers 140, 160 and 180 (as shown in FIG. 3) and the trench structure is composed of four trenches. Moreover, the trench structures are arranged in an array (as shown in FIG. 1). In application, the structure of the bonding pad can be composed more or less than six layers and the trench structure can be composed of more than two trenches. Preferably, in order to release the compressive mechanical stress from any direction to the substrate 100, the trenches in the same trench structure are radially arranged.

The invention includes the following advantages:

1. By using the invention, the trench structure can provide a relatively large contact area. Hence, the adhesion of the dielectric layers and the metal layers can be greatly improved.

2. By using the invention, the compressive mechanical stress from any direction, which is induced while the wire bonding step is performed, can be uniformly released to the substrate through the trench structures in the bonding pad even if the wire width of the integrated circuit is reduced to the sub-micron level.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bonding pad located on a substrate having integrated circuits formed therein, comprising:

dielectric layer having an array of trench structures formed therein formed over the substrate, each trench structure having a plurality of trenches arranged in tetraskelion so that a compressive mechanical stress from any direction of the substrate can be released; and a conductive layer formed on the dielectric layer and filling the trenches, the conductive layer being electrically coupled to the integrated circuits in the substrate through the trenches respectively.

2. The bonding pad of claim 1, wherein the number of the trenches in a trench structure is more than two.

3. The bonding pad of claim 1, wherein the width of the trenches is similar to the size of a contact hole in the integrated circuits.

4. A bonding pad located on a substrate having integrated circuits formed therein, comprising:

dielectric layers and conductive layers alternatingly formed over the substrate, each of the dielectric layers having a plurality of trench structure formed therein, each of the trench structures having a plurality of trenches radially arranged in the dielectric layers, and the trench structures in adjacent dielectric layers being staggered with respect to each other; wherein:
the dielectric layers are electrically coupled to each other through the trenches and one of the dielectric layer above the substrate is electrically coupled to the substrate through the trenches in this particular dielectric layer.

5. The bonding pad of claim 4, wherein the trench structures are arranged in an array.

6. The bonding pad of claim 4, wherein the number of the trenches in a trench structure is more than two.

7. The bonding pad of claim 4, wherein the width of the trenches is similar to the size of a contact hole of the integrated circuits.

8. A bonding pad located on a substrate having integrated circuits formed therein, comprising:

alternating dielectric layers with conductive layers formed over the substrate, each of the dielectric layers having a plurality of trench structure formed therein, each of the trench structures having four trenches arranged in a tetraskelion in the dielectric layers, and the trench structures in adjacent dielectric layers being staggered with respect to each other; wherein:
the dielectric layers are electrically coupled to each other through the trenches and one of the dielectric layer above the substrate is electrically coupled to the substrate through the trenches in this particular dielectric layer.

9. The bonding pad of claim 8, wherein the trench structures are arranged in an array.

10. The bonding pad of claim 8, wherein the number of the trenches in a trench structure is more than two.

11. The bonding pad of claim 8, wherein the width of the trenches is similar to the size of a contact hole of the integrated circuits.

* * * * *